(12) United States Patent
Aspin et al.

(10) Patent No.: US 8,840,813 B2
(45) Date of Patent: Sep. 23, 2014

(54) STRUCTURAL ADHESIVE MATERIALS

(75) Inventors: Ian Aspin, Fowlmere (GB); Marine Godot, Fowlmere (GB)

(73) Assignee: Hexcel Composites Limited, Duxford (GB)

( * ) Notice: Subject to any disclaimer, the term of this patent is extended or adjusted under 35 U.S.C. 154(b) by 601 days.

(21) Appl. No.: 12/601,826

(22) PCT Filed: Jun. 2, 2008

(86) PCT No.: PCT/GB2008/001858
§ 371 (c)(1),
(2), (4) Date: Jul. 6, 2010

(87) PCT Pub. No.: WO2008/146014
PCT Pub. Date: Dec. 4, 2008

(65) Prior Publication Data
US 2010/0276645 A1    Nov. 4, 2010

(30) Foreign Application Priority Data

Jun. 1, 2007 (GB) .................................. 0710425.0

(51) Int. Cl.
| | |
|---|---|
| H01B 1/06 | (2006.01) |
| H01B 1/24 | (2006.01) |
| H01B 1/18 | (2006.01) |
| H01B 1/02 | (2006.01) |
| H01B 1/22 | (2006.01) |
| B32B 25/02 | (2006.01) |
| B32B 25/10 | (2006.01) |
| B32B 27/04 | (2006.01) |
| B32B 27/12 | (2006.01) |
| B32B 5/16 | (2006.01) |
| B32B 27/38 | (2006.01) |
| C09J 9/02 | (2006.01) |
| C09J 11/00 | (2006.01) |
| C09J 11/04 | (2006.01) |
| H05K 9/00 | (2006.01) |
| H05K 3/32 | (2006.01) |
| H01B 1/20 | (2006.01) |
| C08K 9/02 | (2006.01) |
| C08K 7/00 | (2006.01) |

(52) U.S. Cl.
CPC . *C09J 9/02* (2013.01); *H05K 3/321* (2013.01); *C09J 11/00* (2013.01); *H01B 1/24* (2013.01); *H01B 1/22* (2013.01); *C09J 11/04* (2013.01); *H01B 1/20* (2013.01); *C09J 2205/11* (2013.01); *H05K 9/0083* (2013.01); *C08K 9/02* (2013.01); *C08K 7/00* (2013.01)
USPC ........... 252/512; 252/506; 252/508; 252/211; 252/513; 252/514; 428/295.1; 428/296.4; 428/297.4; 428/300.1; 428/323; 428/414

(58) Field of Classification Search
USPC ........................................................ 252/500
See application file for complete search history.

(56) References Cited

U.S. PATENT DOCUMENTS

| | | | |
|---|---|---|---|
| 4,740,657 A * | 4/1988 | Tsukagoshi et al. ........ | 174/88 R |
| 5,240,761 A | 8/1993 | Calhoun et al. | |
| 5,951,918 A * | 9/1999 | Kuwajima et al. ............ | 174/257 |
| 6,126,865 A | 10/2000 | Haak et al. | |
| 6,533,963 B1 * | 3/2003 | Schleifstein et al. ......... | 252/511 |
| 6,592,986 B1 | 7/2003 | Hakotani et al. | |
| 2004/0016913 A1 | 1/2004 | Sognefest | |
| 2007/0241303 A1* | 10/2007 | Zhong et al. ............. | 252/62.3 T |

FOREIGN PATENT DOCUMENTS

WO       9827178       6/1998

* cited by examiner

*Primary Examiner* — Harold Pyon
*Assistant Examiner* — Tanisha Diggs
(74) *Attorney, Agent, or Firm* — W. Mark Bielawski; David J. Oldenkamp

(57) ABSTRACT

An adhesive material comprising at least one adhesive polymeric resin, at least one low aspect ratio metal-coated additive, and at least one high aspect ratio metal-coated additive. There is additionally provided an adhesive material comprising at least one adhesive polymeric resin, and one of either; a) low aspect ratio metal-coated additives present in the range 0.2 wt. % to 30 wt. % of the adhesive material; or b) discrete high aspect ratio metal-coated additives present in the range 0.2 wt. % to 25 wt. % of the adhesive material.

20 Claims, 6 Drawing Sheets

STRUCTURAL ADHESIVE MATERIALS

This is an application filed under 35 U.S.C. 371 of PCT/GB08/01858, filed Jun. 2, 2008 which claims priority from GB Application 0710425.0, filed Jun. 1, 2007.

The present invention relates to adhesive materials, and particularly, but not exclusively to, structural pastes and film adhesive materials.

Adhesive materials or structural pastes are well known in various fields. In particular, structural pastes and film adhesives are well known in the aerospace and wind energy industries, whilst electrically-conductive pastes and films are known for use mostly in the electronics and the packaging industry. The adhesive materials are often used due to their low weight in comparison to conventional alternatives. However, the adhesives often have very low inherent electrical conductivity, with correspondingly high electrical resistivity.

The low electrical conductivity exhibited by these adhesive materials can be disadvantageous in certain applications in which the ability to dissipate energy from an electrical discharge is necessary. Examples of such applications include protection against lightning strikes, electromagnetic interference (EMI), and electrostatic dissipation (ESD). Conventional adhesive joints are liable to incur an unacceptable degree of damage if subjected to high electrical discharges, resulting in volatilisation of the adhesive line and thereby causing debonding of joints to which the adhesive is applied.

One approach to overcome the above problem is to use adhesives having braids attached to non-metallic structures (often linking non-metallic to metallic structures) to provide for safe dissipation of energy or electrical discharge along a conducting path in the adhesive. Braids can provide improved electro-magnetic protection for both the adhesive, and the structure which the adhesive is a constituent of, but at the disadvantage of increased expense and increased weight. This increased expense and weight is particularly disadvantageous in fields where increased component weight is undesirable.

Alternatively, bolts or fasteners are used in joints in aerospace applications to increase electrical conductivity of the adhesive. However, the use of bolts and fasteners is limited due to the resulting increased weight, thereby limiting possible use especially where lightweight solutions are desired for composite structures.

Other solutions to provide electrically conductive adhesive materials have been derived from the electronics and packaging industry. These adhesives are usually based upon systems which are very highly loaded with silver (usually 80-90 wt. %). However, silver loaded adhesives are very expensive, particularly heavy, and often result in materials with mechanical properties at levels lower than required for many typical applications, such as aerospace applications.

Adhesives comprising electrically dissipative polymers and resins have also been attempted, but have been found not to provide sufficient electrical conductivity for applications such as lightening strike protection for aeroplane and turbine blades.

Increasing use of composite materials, particularly in the aerospace field, requires supporting products, like adhesives and structural pastes, which provide electrical conductivity levels approaching that of metals in order to complement composite design capabilities.

The present invention therefore seeks to provide an adhesive material which has improved electrical conductivity properties in comparison to prior attempts as described herein, and which is convenient to manufacture, use, and repair.

The present invention further seeks to provide a method of making the adhesive material having improved electrical conductivity properties.

According to a first aspect of the present invention there is provided an adhesive material comprising at least one adhesive polymeric resin, at least one low aspect ratio metal-coated additive, and at least one high aspect ratio metal-coated additive.

According to a second aspect of the present invention there is provided a method of making the adhesive material of the first aspect comprising mixing:
- at least one adhesive polymeric resin;
- at least one low aspect ratio metal-coated additive; and
- at least one high aspect ratio metal-coated additive.

According to a third aspect of the present invention there is provided the use of at least one low aspect ratio metal-coated additive and at least one high aspect ratio metal-coated additive for reducing an initial bulk electrical resistivity of a constituent adhesive polymeric resin of an adhesive material, said adhesive material comprising at least one adhesive polymeric resin and said metal-coated additives.

According to a fourth aspect of the present invention there is provided an adhesive material comprising at least one adhesive polymeric resin, and one of either;
  a) low aspect ratio metal-coated additives present in the range 0.2 wt. % to 30 wt. % of the adhesive material; or
  b) discrete high aspect ratio metal-coated additives present in the range 0.2 wt. % to 25 wt. % of the adhesive material.

According to a fifth aspect of the present invention there is provided a method of making the adhesive material of the fourth aspect comprising mixing at least one adhesive polymeric resin with one of either;
  a) low aspect ratio metal-coated additives in the range 0.2 wt. % to 30 wt. % of the adhesive material; or
  b) discrete high aspect ratio metal-coated additives in the range 0.2 wt. % to 25 wt. % of the adhesive material.

According to a sixth aspect of the present invention there is provided the use of either low aspect ratio metal-coated additives in the range 0.2 wt. % to 30 wt. % of an adhesive material, or discrete high aspect ratio metal-coated additives in the range 0.2 wt. % to 25 wt. % of an adhesive material, for reducing an initial bulk electrical resistivity of a constituent adhesive polymeric resin of the adhesive material, said adhesive material comprising at least one adhesive polymeric resin and said metal-coated additives.

It has been found that a combination high aspect ratio additives and low aspect ratio additives, such as silver coated glass beads and silver coated glass fibres, in a adhesive polymeric resin of an adhesive material greatly reduces its bulk electrical resistivity in the z-direction (through the thickness). This results in improved electrical conductivity through the adhesive material. Additionally, the same improvements in electrical conductivity can be obtained by using only the low aspect ratio or high aspect ratio metal-coated additives at low loading amounts (i.e. low aspect ratio metal-coated additives at 0.2 wt. % to 30 wt. % or discrete high aspect ratio metal-coated additives at 0.2 to 25 wt. %).

In comparison to prior attempts such as nickel coated carbon mats, there is no requirement for a fibre mat, thereby allowing the present invention to be used for paste applications where use of film adhesives would not be suitable.

Additionally, in comparison to use of high loadings of silver beads, the present invention provides for low loadings of additives in the adhesive material resulting in a lower cost adhesive material, lower weight, and retention of structural strength allowing the present invention to be used for structural applications.

The adhesive material is arranged between the joint substrates, and facilitates the electrical conduction between the substrates. The reduction in bulk electrical resistivity and improvement in conductivity of the adhesive material provides improved electrical transfer between the bonded substrates, thus providing for dissipation of electric discharge energy, and more specifically improved lightning strike performance.

Additionally, it has been found that the use of either low or high aspect ratio metal-coated additives, or a combination of low and high aspect ratio metal-coated additives distributed in the adhesive material surprisingly results in substantially similar handling and mechanical characteristics in comparison with equivalent unmodified adhesive materials. The metal-coated additives provide for little additional weight compared to an unmodified adhesive material, and with little substantial detriment to the mechanical performance of the adhesive material (e.g. adhesion/bonding, lap shear strength, viscosity, compression, or flexibility).

The improvements achieved by the present invention are surprising in view of the low levels of metal-coated additives employed, and the high electrical resistivity normally exhibited by unmodified adhesive materials.

It is envisaged that the terms "resistivity" and "conductivity" used herein refer to electrical resistivity and electrical conductivity respectively.

Bulk resistivity refers to the measurement of the "bulk" or "volume" electrical resistivity of a semi-conductive or conductive adhesive material. It can be seen that reference to an "initial bulk resistivity" relates to the bulk resistivity of an adhesive material prior to addition of metal-coated additives. The value of bulk resistivity is the inherent resistance of a given material with relation to its volume. The values are usually measured and expressed in units of ohm meters ($\Omega$m) for the conductivity of a three dimensional material. The bulk electrical resistivity $\rho_v$ of a material is usually defined by the following:

$$\rho_V = \frac{RA}{t}$$

where:
 $\rho_v$ is the volume/bulk resistivity (measured in ohm meters);
 R is the electrical resistance of a uniform specimen of the material measured between two parallel sides of the adhesive bondline (measured in ohms);
 t is the thickness of the adhesive bondline (measured in meters)—and equals the distance between the substrates and the potential electrodes; and
 A is the overlap area of the joint (measured in square meters).

In the present invention, the volume resistivity is only measured in the z-direction (through the joint). In every case it is referenced as the "volume" resistivity as the thickness is always taken into consideration in the calculation. However in conditions where the conductive additives both control the thickness and change the electrical conductivity, establishment "volume resistivity" is calculated the same way but the actual term becomes inaccurate.

As used herein, the term "discrete" refers to three dimensional shaped additives which are distinct, treated as an individual unit, and separable from other individual additives. Discrete additives are distinct elements having a separate identity, but this does not preclude additives from being in contact with one another. The term embraces the shapes and sizes of high aspect metal coated additives described and defined herein.

The term "aspect ratio" used herein is understood to refer to the ratio of the longest dimension to the shortest dimension of a three dimensional body. The term is applicable to additives of any shape and size as used herein. Where the term is used in relation to spherical or substantially spherical bodies, the relevant ratio would be that of the largest cross sectional diameter to the smallest cross sectional diameter of the spherical body. It will therefore be understood that a perfect sphere would have an aspect ration of 1:1. The aspect ratios as specified herein for metal-coated additives are based on the dimensions of the additives after the metal coating has been applied.

The term "low aspect ratio metal-coated additive" used herein refers to any suitable three dimensional body which could be partially or completely covered by a metal coating, and which is capable of reducing the bulk resistivity of the adhesive polymeric resin, thereby facilitating electrical conductivity of the adhesive material.

The metal-coated low aspect ratio additives used in the present invention may comprise any suitable three dimensional additives which are capable of being coated by metal. It is envisaged that the suitable three dimensional additives may include any elements of any size and shape having a low aspect ratio as defined herein.

The low aspect ratio metal-coated additives are metal-coated additives having an aspect ratio of less than 10:1. Preferably, the aspect ratio is less than 5:1. More preferably, the aspect ratio is less than 2:1.

Suitable low aspect ratio metal-coated additives may be selected from, by way of example, particles, spheres, microspheres, dendrites, beads, any other suitable three-dimensional additives, or any combination thereof.

The low aspect ratio metal-coated additives are preferably metal-coated microspheres or beads.

The low aspect ratio metal-coated additives may comprise a core material which may be completely or partially coated by at least one suitable metal.

The core material may be formed from any suitable material that is capable of being completely or partially coated with a metal. Suitable core materials, by way of example, include any three dimensional bodies formed from polymer, rubber, ceramic, glass, carbon, metal, metal alloy, mineral, or refractory products such as fly ash.

Suitable three dimensional bodies for the core material include, by way of example, particles, spheres, microspheres, dendrites, beads, any other suitable three-dimensional bodies, or any combination thereof.

The core material formed from polymer may be formed from any suitable thermoplastic or thermosetting polymer. The terms "thermoplastic polymer" and "thermosetting polymer" are as characterised herein.

The core material formed from glass may be any of the types used for making solid or glass microspheres. Suitable glass may contain silica, or may be substantially silica free. Examples of suitable silica containing glass include soda glass, borosilicate, and quartz. Alternatively, a suitable substantially silica free glass is, by way of example, chalcogenide glass.

The core material formed from metal or metal alloys may be of any suitable metal or metal alloys having high electrical conductivity. Suitable metal or metal alloys include, by way of example, silver, gold, nickel, copper, tin, aluminium, platinum, palladium, bronze, or brass.

The core material may be porous or hollow, or may itself comprise a core-shell structure, for example core-shell polymer particles.

The core materials may be first coated with an activating layer, adhesion promoting layer, primer layer, semi-conducting layer, or other suitable layer, prior to being coated by metal.

The core material may preferably be in the form of microspheres or beads. Suitable microspheres or beads may be formed from any of the materials listed as being suitable for forming the core material.

Preferably, the metal-coated microspheres or beads are formed from metal, metal alloys, glass, or polymer. More, preferably, the metal microspheres are formed from glass or polymer.

The microspheres or beads may be porous or hollow, or may themselves comprise a core-shell structure, for example core-shell polymer particles. Use of hollow low aspect ratio metal-coated additives in general, hollow metal-coated microspheres, or hollow metal-coated beads in particular, may be advantageous for applications where weight reduction is of particular importance.

The microspheres or beads may be first coated with an activating layer, adhesion promoting layer, primer layer, semi-conducting layer, or other suitable layer, prior to being metal-coated.

Alternatively, mixtures of microspheres or beads may be used to obtain, for example, lower densities of the adhesive material, or other useful properties. For example, metal-coated hollow glass beads may be used with metal-coated rubber beads to obtain a toughened layer with a lower specific gravity.

The low aspect ratio metal-coated additives may generally have a size in the range 2 μm to 250 μm.

The low aspect ratio metal-coated additives may be of a size to facilitate contact between other metal-coated additives. In this embodiment, the low aspect ratio metal-coated additives may have a size dispersion with at least 60% of the additives having a size in the range 2 μm to 80 μm. Preferably, with at least 60% of the additives having a size in the range 5 μm to 60 μm. Most preferably, with at least 60% of the additives having a size in the range 10 μm to 40 μm.

In an alternative embodiment, the low aspect ratio metal-coated additives may be of a size to directly bridge the substrate, and therefore may be of a size substantially equal to the bondline thickness. In this embodiment, the low aspect ratio metal-coated additives may have a size dispersion with at least 80% of the additives having a size in the range 80 μm to 250 μm. Preferably, with at least 80% of the additives having a size in the range 80 μm to 200 μm. Most preferably, with at least 80% of the additives having a size in the range 80 μm to 150 μm.

It is envisaged that when low aspect ratio metal-coated additives are used in the absence of high aspect ratio metal-coated additives, they may have a size dispersion where at least 80% of the additives have a size in the range 80 μm to 250 μm. The low aspect ratio additives when used on their own would therefore provide conductance by bridging the bondline, providing spacing, and control of the bondline thickness.

The low aspect ratio metal-coated additives may be present in the range 0.2 wt. % to 30 wt. % of the adhesive material. More preferably, they may be present in the range 1 wt. % to 20 wt. %. Most preferably, they may be present in the range 2 wt. % to 15 wt. %.

Where the size of the low aspect ratio metal-coated additives is substantially equal to the bondline thickness, the low aspect ratio metal-coated additives may possess an aspect ratio of less than 5:1. Preferably, the aspect ratio may be less than 2:1. More preferably, the aspect ratio may be less 6:5.

The term "high aspect ratio metal-coated additive" used herein refers to any suitable three dimensional additive which could be partially or completely covered by a metal coating, and which is capable of reducing the bulk resistivity of the adhesive polymeric resin, thereby facilitating electrical conductivity of the adhesive material.

The metal-coated high aspect ratio additives used in the present invention may comprise any suitable three dimensional additives that are capable of being coated by metal. It is envisaged that the suitable three dimensional additives may include any elements of any size and shape having a high aspect ratio as defined herein.

The high aspect ratio metal-coated additives are metal-coated additives having an aspect ratio greater than 10:1.

Suitable high aspect ratio metal-coated additives may be selected from, by way of example, particles, fibres, flakes, rods, any other three-dimensional particles, or any combination thereof.

The high aspect ratio metal-coated additives may comprise a core material which may be completely or partially coated by at least one suitable metal.

The core material may be formed from any suitable material that is capable of being partially or completely covered by a metal coating, Suitable core materials which could be metal-coated include any three dimensional bodies formed from, by way of example, polymer, rubber, ceramic, glass, carbon, metals, metal alloys, mineral, or any combination thereof.

Suitable three dimensional bodies for the core material include, by way of example, particles, fibres, flakes, rods, any other suitable three-dimensional bodies, or any combination thereof.

The core material formed from polymer may be formed from any suitable thermoplastic or thermosetting polymer. The terms "thermoplastic polymer" and "thermosetting polymer" are as characterised herein.

The core material formed from glass may be any of the types used for making solid or glass microspheres. Suitable glass may contain silica, or may be substantially silica free. Examples of suitable silica containing glass include soda glass, borosilicate, and quartz. Alternatively, a suitable substantially silica free glass is, by way of example, chalcogenide glass.

The core material formed from metal or metal alloys may be of any suitable metal or metal alloys having high electrical conductivity. Suitable metal or metal alloys include, by way of example, silver, gold, nickel, copper, tin, aluminium, platinum, palladium, bronze, or brass.

Preferred core materials which can be used in a metal-coated form include carbon nanotubes, carbon nanofibres or any high aspect ratio three dimensional body made from polymer, glass, carbon, metal or metal alloys.

Suitable core materials formed from fibres include glass fibres, carbon fibres, carbon nanotubes, carbon nanofibres, and suitable polymer based fibres.

Particularly preferred core materials include glass fibres and carbon fibres.

Metal-coated fibres or metal-coated flakes are preferred as the high aspect ratio metal-coated additives. Particularly preferred are metal-coated fibres.

The high aspect ratio metal-coated additives may be used in any suitable combination in the adhesive material. Suitable combinations of metal-coated additives include metal-coated intrinsically conducting polymer fibres (ICPs—including polypyrrole, polythiophene, and polyaniline), and metal-coated glass fibres.

The high aspect ratio metal-coated additives may have a size dispersion with at least 80% of the additives having a size in the range 10 μm to 6,000 μm. Preferably, with at least 80% of the additives having a size in the range 50 μm to 1,000 μm. Most preferably, with at 80% of the additives having a sized in the range 80 μm to 300 μm.

In an embodiment where the high aspect ratio metal-coated additives are metal-coated fibres, the metal-coated fibres may have a size dispersion with at least 80% of the fibres having a size in the range 50 μm to 6,000 μm. Preferably, with at least 80% of the fibres having a size in the range 80 μm to 1,000 μm. Most preferably, with at least 80% of the fibres having a size in the range 100 μm to 400 μm.

In particular, it is envisaged that high aspect ratio metal-coated additives having core fibres formed from glass fibres or carbon fibres may have a length in the range 100 μm to 300 μm.

In the embodiment where the core fibres are carbon nanofibres, the additives may have a length in the range 10 μm to 100 μm. It is also envisaged that where the core fibres are carbon nanotubes, the additives may have a length in the range 1 μm to 15 μm.

Core materials based on fibres may have a diameter in the range 1 μm to 25 μm. In particular, it is envisaged that core materials based on carbon nanotubes or carbon nanofibres may have a diameter in the range 0.50 μm (500 nm) to 1 μm.

In an embodiment where the high aspect ratio metal-coated additives are metal-coated fibres, the metal-coated fibres may have an aspect ratio in the range 10:1 to 10,000:1. Preferably, the aspect ratio is in the range 10:1 to 1,000:1. More preferably, the aspect ratio is in the range 10:1 to 100:1.

In particular, where the metal-coated fibres are formed from carbon nanotubes or carbon nanofibres, the aspect ratio may be in the range 30:1 to 10,000:1.

The high aspect ratio metal-coated additives may be present in the range 0.2 wt. % to 25 wt. % of the adhesive material. More preferably, they may be present in the range 1 wt. % to 20 wt. %. Most preferably, they may be present in the range 2 wt. % to 15 wt. %.

Metals suitable for coating either the low aspect ratio or high aspect ratio metal-coated additives include, by way of example, silver, gold, nickel, copper, tin, aluminium, platinum, palladium, and other metals which may have high electrical conductivity.

Additionally, it is envisaged that metals suitable for coating the additives may include metal alloys having high electrical conductivity. Suitable alloys, by way of example, include bronze, brass, sterling silver, pewter, cupronickel, duralumin, or any other suitable alloys.

Preferred metals and metal alloys which can be used for coating additives include silver, nickel, copper, and their alloys. A particularly preferred metal which can be used for coating additives is silver.

Multiple layers of metal coatings may be used to coat the additives, for example gold coated copper, or silver coated copper. Any suitable combination of metals may be used to provide multiple layers of metal coatings. Simultaneous deposition of metals may also be used, thereby producing mixed metal coatings. The mixed metal coatings may provide enhanced properties such as conductivity, corrosion resistance, or energy dissipation.

The metal coating may be carried out by any of the means known for coating additives. Examples of suitable coating processes include chemical vapour deposition, sputtering, electroplating, or electroless deposition.

The metal may be present as bulk metal, porous metal, columnar, microcrystalline, fibrillar, dendritic, or any other form known in metal coating.

The metal coating, once applied to the additive, may provide a smooth surface. In an alternative embodiment, the metal coating, once applied to the additive, may comprise surface irregularities such as fibrils, or bumps so as to increase the specific surface area and improve interfacial bonding.

The metal coating may be subsequently treated with any agents known in the art as being suitable for improving interfacial bonding with the adhesive polymeric resin. Agents which may be used, by way of example, include silanes, titanates, and zirconates.

The additives, once coated with metal, may be of any suitable shape for example spherical, ellipsoidal, spheroidal, discoidal, dendritic, rods, discs, acicular, cuboid or polyhedral. The metal-coated additives may have well defined geometries or may be irregular in shape.

The electrical resistivity of the metal coating should be preferably less than $3\times10^{-5}$ Ωm, more preferably less than $1\times10^{-7}$ Ωm, and most preferably less than $3\times10^{-8}$ Ωm.

The metal-coated additive size distribution may be monodisperse or polydisperse.

The metal-coated additives are distributed in the uncured or unprocessed adhesive material. It is envisaged that the term "distributed" includes where the metal-coated additives may be present throughout the entire adhesive material. Alternatively, the term includes the metal-coated additives being present in substantially higher concentrations in specific parts or localised areas of the uncured or unprocessed adhesive material.

The term "distributed" also includes the embodiment where the metal-coated additives are present throughout the entire adhesive material before application to the joint. Once the adhesive material is applied to the substrate, the additives may continue to be distributed throughout the entire adhesive material, or may be present in localised areas of the material.

The metal-coated additives may be substantially present in the adhesive polymeric resin of the adhesive material. Preferably, at least 90 wt. % of the metal-coated additives may be present in the adhesive polymeric resin. More preferably, at least 95 wt. %. Most preferably, at least 99 wt. %.

The metal-coated additives may be suitably distributed within the adhesive polymeric resin of the adhesive material by conventional methods, including mixing or blending operations.

It is envisaged that the adhesive polymeric resin will have an initial bulk electrical resistivity that is lowered by addition of the metal-coated additives in accordance with the first aspect or the fourth aspect of the present invention.

The metal-coated additives may be used alone or in any suitable combination. Suitable combinations include, by way of example, metal-coated microspheres or metal-coated beads with metal-coated fibres distributed in the adhesive material.

Preferred combinations of metal-coated additives may include high aspect ratio metal-coated fibres and low aspect ratio metal-coated beads in a ratio of 3:1.

Particularly preferred combinations of metal-coated additives of the present invention include glass or carbon fibres coated with silver or nickel, in combination with solid or hollow glass spheres or polymer beads also coated in silver.

A suitable combination of metal-coated beads and metal-coated fibres, by way of example, is silver coated glass fibre having lengths in the range 150 to 300 μm with silver coated hollow glass beads having a size in the range 10 to 40 μm.

A further embodiment of the present invention for providing a toughened layer with a lower specific gravity may be obtained by use of a mixture of metal-coated carbon fibres with metal-coated rubber beads.

Mixtures of metal-coated additives having different sizes, shapes, and formed from different materials with different coatings may be used. Such mixtures may be adapted to obtain useful properties for the adhesive material. For example, better process-ability or increased electrical conductivity with a lower increase in viscosity, may be obtained by use of a mixture of hollow metal-coated beads with metal-coated fibres.

The adhesive polymeric resin of the adhesive material is preferably formed from a thermoset or thermoplastic resin which can form a suitable adhesive.

The term "polymer", "polymeric resin", "polymeric system", and "resin" are used interchangeably in the present application, and are understood to refer to mixtures of resins having varying chain lengths. The term polymeric therefore includes embodiments where the resins present are in the form of a resin mixture comprising any of monomers, dimers, trimers, or resins having chain length greater than 3. The resulting polymers, when cured, form a crosslinked resin matrix. References to specific resins throughout the description may be to monomer components which would be used to form the resulting resin, unless otherwise specified.

The term 'thermoset resin' includes any suitable thermoset resin material which is plastic and usually liquid, powder, or malleable prior to curing and designed to be moulded in to a final form. Once cured, a thermoset resin is typically not suitable for melting and remoulding.

Suitable thermoset resin materials for the present invention include, but are not limited to, any of the following either alone or in combination; resins of phenol formaldehyde, resins of urea-formaldehyde, resins of 1,3,5-triazine-2,4,6-triamine (Melamine), bismaleimide resins, epoxy resins, vinyl ester resins, benzoxazine resins, phenolic resins, polyester, unsaturated polyester resins, or cyanate ester resins.

The thermoset resin is more preferably selected from epoxy resins, cyanate ester resins, bismaleimide resins, vinyl ester resins, benzoxazine resins, or phenolic resins.

The thermoset resin is most preferably selected from resins comprising at least one of bisphenol-A (BPA) diglycidyl ether and/or bisphenol-F (BPF) diglycidyl ether and derivatives thereof; tetraglycidyl derivatives of 4,4'-diaminodiphenylmethane (TGDDM), triglycidyl derivatives of aminophenols (TGAP), epoxy novolacs and derivatives thereof, and other glycidyl ethers and glycidyl amines well known in the art.

The term 'thermoplastic resin' includes any suitable material which is plastic or deformable, melts to a liquid when heated and freezes to a brittle, glassy state when cooled sufficiently. Once formed and cured, a thermoplastic resin is typically suitable for melting and re-moulding.

Suitable thermoplastic polymers for use with the present invention include any of the following either alone or in combination: polyether sulphone (PES), polyether ethersulphone (PEES), polyphenyl sulphone, polysulphone, polyester, polymerisable macrocycles (e.g. cyclic butylene terephthalate), liquid crystal polymers, polyimide, polyetherimide, aramid, polyamide, polyester, polyketone, polyetheretherketone (PEEK), polyurethane, polyurea, polyarylether, polyarylsulphides, polycarbonates, polymethyl methacrylate (PMMA), polyphenylene oxide (PPO), and modified PPO.

Suitable examples of formulated adhesives polymeric resins which can be used include Redux®870 and Redux®330 (both available commercially from Hexcel Composites of Duxford, UK).

Without wishing to be unduly bound by theory, it has been found that the benefits of the invention may be conferred due to the low aspect ratio and high aspect ratio metal-coated additives acting as electrical conductance bridges, thereby improving the electrical conductance. The metal-coated additives therefore facilitate electrical conductivity by lowering the bulk resistivity of the adhesive material.

As previously mentioned, the benefits of the invention are also that this conductivity improvement is achieved with low amount of additives. The use of either high or low aspect ratio additives, either alone or in combination, provides good conductivity improvements with limited effects on mechanical properties and process-ability. Metal-coated fibres may act as long pathways to bridge substrates, with metal-coated particles filling the gaps between the metal-coated fibres, thereby reducing contact resistance and minimising any unwanted viscosity change.

The adhesive material may additionally comprise metallic particles. It will be understood that this would include any suitable particles with a metallic core and capable of further enhancing the electrical conductivity of the adhesive material. It will be understood that the metallic particles do not comprise a metal coating.

The metallic particles may be of any suitable shape, for example, fibrous, spherical, ellipsoidal, spheroidal, discoidal, dendritic, rods, discs, acicular, cuboid or polyhedral. The metallic particles may have well defined geometries or may be irregular in shape.

The metallic particles may be formed from, by way of example, silver, gold, nickel, copper, tin, aluminium, platinum, palladium, and other metals known to possess high electrical conductivity.

Additionally, it is envisaged that the metallic particles may be made from alloys known to possess high electrical conductivity. Suitable alloys, by way of example, may include bronze, brass, sterling silver, pewter, cupronickel, duralumin, or any other suitable alloys.

The adhesive material may also include non-metallic conductive particles. It will be understood that this would include any suitable non-metallic particles capable of reducing bulk resistivity and thereby enhancing the electrical conductivity of the adhesive material. It will be understood that the non-metallic particles do not comprise a metal coating.

Suitable non-metallic particles include, by way of example, any of the following either alone or in combination; graphite flakes, graphite powders, graphite particles, graphene sheets, carbon nanotubes, carbon nanofibres, fullerenes, carbon black, intrinsically conducting polymers (ICPs—including polypyrrole, polythiophene, and polyaniline), or charge transfer complexes.

Particularly preferred non-metallic particles include carbon nanofibres, carbon nanotubes, carbon black, graphite, and polyaniline.

An example of a suitable combination of non-metallic conducting particles includes combinations of ICPs with carbon nanofibres and carbon black.

The metallic and non-metallic conductive particles, if present, would be combined with the metal-coated additives in the adhesive material. It is envisaged that any suitable combination may be used.

Suitable combinations of non-metallic particles and metal-coated additives include, by way of example, silver coated glass fibres and silver coated hollow glass beads, with non-metal-coated carbon nanofibres.

The adhesive material may optionally comprise at least one carrier. It will be understood that this would include any suitable conductive or non-conductive carrier capable of controlling the bondline thickness of the joint. It will also be understood that conductive carrier would include any suitable metal-coated or non-coated carriers which may be capable of further reducing bulk resistivity of the adhesive polymeric resin, and thereby enhancing the electrical conductivity of the adhesive material.

Suitable carriers may be selected from hybrid or mixed fibre systems which comprise synthetic or natural fibres, or a combination thereof. The carrier fibres may preferably be selected from glass, carbon, graphite, polymer, and intrinsically conductive polymers (thermoplastic or thermoset as defined herein).

The carrier fibre system may be in the form of random, knitted, woven, non-woven, multiaxial or any other suitable textile pattern. The fibre pattern is preferably selected from knitted and random styles.

Such styles and forms are well known in the composite field, and are commercially available from Heathcoat Fabrics of Tiverton, UK, Technical Fibre Products of Kendal, UK, and Marktek Inc. of Chesterfield, USA.

The carriers may be coated with metals. Suitable metals, and methods of metal coating, are as already characterised herein for the metal-coated additives.

Specific examples of suitable non-conductive carriers include, by way of example, thermoplastic carriers A1050 and F0826 (available commercially from Heathcoat Fabrics of Tiverton, UK). Suitable conductive carriers include nickel-coated carbon fibre random mats 20404E (available commercially from Technical Fibre Products of Kendal, UK), and nickel-coated carbon fibre random mats NC10004011T (available commercially from Marktek Inc. of Chesterfield, USA).

The adhesive material may include at least one curing agent. The curing agent may be present in the adhesive polymeric resin or, for example, as a separate part to be added prior to application of the adhesive material to the substrates or joints.

Suitable curing agents are those which facilitate the curing of the adhesive polymeric resin compounds of the invention. It is envisaged that one curing agent may be used, or in an alternate embodiment a combination of two or more such curing agents may be used.

Curing agents typically include cyanoguanidine, aromatic, aliphatic and alicyclic amines, acid anhydrides, Lewis Acids, substituted ureas and urones, imidazoles and hydrazines.

Exemplary preferred curing agents include aromatic, aliphatic, alicyclic amines, polyamidoamines, or any combination thereof.

Suitable curing agents may be selected from anhydrides, particularly polycarboxylic anhydrides, such as nadic anhydride (NA), methylnadic anhydride, phthalic anhydride, tetrahydrophthalic anhydride, hexahydrophthalic anhydride, methyltetrahydrophthalic anhydride, pyromellitic dianhydride, methylhexahydrophthalic anhydride, chloroendic anhydride, endomethylene tetrahydrophthalic anhydride, or trimellitic anhydride.

Further suitable curing agents are amines, including aromatic amines, e.g. 1,3-diaminobenzene, 1,4-diaminobenzene, 4,4'-diaminodiphenylmethane, benzenediamine (BDA); aliphatic amines such as ethylenediamine (EDA), m-xylylenediamine (mXDA), diethylenetriamine (DETA), triethylenetetramine (TETA), trioxatridecanediamine (TTDA), polyoxypropylene diamine, and further homologues, alicyclic amines such as diaminocyclohexane (DACH), isophoronediamine (IPDA), 4,4' diamino dicyclohexyl methane (PACM), bisaminopropylpiperazine (BAPP), N-aminoethylpiperazine (N-AEP), polyaminosulphones, such as 4,4'-diaminodiphenyl sulphone (4,4'-DDS), and 3,3'-diaminodiphenyl sulphone (3,3'-DDS) as well as polyamides, polyamines, amidoamines, polyamidoamines, polycycloaliphatic polyamines, polyetheramide, imidazoles, dicyandiamide.

In particular, more preferred curing agents include dicyandiamide (DICY), 4,4'-diaminodiphenyl sulphone (4,4'-DDS), 3,3'-diaminodiphenyl sulphone (3,3'-DDS), m-xylylenediamine (mXDA), diethylenetriamine (DETA), triethylenetetramine (TETA), polyoxypropylene diamine, trioxatridecanediamine (TTDA), isophoronediamine (IPDA), and their homologues.

Suitable curing agents may also include phenol-formaldehyde resins, such as the phenol-formaldehyde, p-t-butylphenol-formaldehyde, and p-n-octylphenol-formaldehyde resin.

Yet further suitable resins containing phenolic groups can be used, such as resorcinol based resins, and resins formed by cationic polymerisation, such as dicyclopentadiene-phenol copolymers. Still additional suitable resins are melamine-formaldehyde resins, and urea-formaldehyde resins.

Different commercially available compositions may be used as curing agents in the present invention. One such composition is AH-154, a dicyandiamide type formulation, available from Ajinomoto USA Inc. Others which are suitable include Ancamide 1284, which is a mixture of 4,4'-methylenedianiline and 1,3-benzenediamine; these formulations are available from Pacific Anchor Chemical, Performance Chemical Division, Air Products and Chemicals, Inc., Allentown, USA.

The curing agent is selected such that it provides curing of the resin component of the adhesive material when combined therewith at suitable temperatures. The amount of curing agent required to provide adequate curing of the resin component will vary depending upon a number of factors including the type of resin being cured, the desired curing temperature and curing time. The particular amount of curing agent required for each particular situation may be determined by well-established routine experimentation. The curing agent may be used either alone, or in any combination with one or more other curing agent.

The total amount of curing agent, if present, may be present in the range 1 wt. % to 45 wt. % of the adhesive material. More preferably, curing agent may be present in the range 2 wt. % to 30 wt. %. Most preferably, curing agent may be present in the range 5 wt. % to 25 wt. %.

The adhesive material may comprise an additional polymeric resin which is at least one thermoset or thermoplastic resins as previously defined.

The adhesive material may also include additional ingredients such as performance enhancing or modifying agents. The performance enhancing or modifying agents, by way of example, may be selected from flexibilisers, toughening agents/particles, additional accelerators, core shell rubbers, flame retardants, wetting agents, expanding and blowing agents, pigments/dyes, flame retardants, plasticisers, UV absorbers, anti-fungal compounds, fillers, viscosity modifiers/flow control agents, tackifiers, stabilisers, and inhibitors.

Toughening particles/agents may include, by way of example, any of the following either alone or in combination: polyamides, copolyamides, polyimides, aramids, polyketones, polyetheretherketones, polyarylene ethers, polyesters, polyurethanes, polysulphones, high performance hydrocarbon polymers, liquid crystal polymers, PTFE, elastomers, segmented elastomers such as reactive liquid rubbers based on homo or copolymers of acrylonitrile, butadiene, styrene, cyclopentadiene, acrylate, or polyurethane rubbers.

Toughening particles/agents, if present, may be present in the range 0.1 wt. % to 45 wt. % of the adhesive material. More preferably, the toughening particles/resin may be present in the range 5 wt. % to 30 wt. %. Most preferably, the toughening particles/resin may be present in the range 10 wt. % to 28 wt. %.

Suitable toughening particles/agents include, by way of example, Sumikaexcel 5003P, which is commercially available from Sumitomo Chemicals. Alternatives to 5003P are Solvay polysulphone 105P, and Solvay 104P, both commercially available from Solvay SA.

Suitable accelerators, which may be used alone or in combination, include urones, phenyl urea or other ureas such as, N,N-dimethyl, N'-3,4-dichlorphenyl urea (Diuron), N'-3-chlorophenyl urea (Monuron), N,N-(4-methyl-m-phenylene bis[N',N'-dimethylurea] (TDI urone), phenols and alcohols such as sulfonyldiphenol (Bisphenol S) and other based on aromatic and aliphatic amines such as benzyldimethylamine (BDMA).

Suitable fillers may include, by way of example, any of the following either alone or in combination: inorganic oxides or metallic oxides such as silicas, aluminas, titania, glass, calcium carbonate, and calcium oxide.

The adhesive material containing all the necessary metal-coated particles and optional additives and carriers, can be processed by any of the known methods to manufacture and apply adhesives, for example a so-called lacquer process, resin film process, extrusion, spraying, cartridge dispenser process, printing, or other known methods.

Multiple layers of adhesive materials may be used. Thus, by way of example, an assembly may be prepared using a layer of standard adhesive materials, and a layer of adhesive materials comprising metal-coated additives of the present invention, thus enhancing the conductivity of the final assembly. Optionally, where an adhesive material of the present invention is used, an electrically isolating layer or non-conducting carrier layer can be placed between the adhesive material layers and a substrate surface in localised area where a conductive path is not desirable. For example, a glass reinforced fibrous layer can be used as the isolating layer. It is understood that there are many possible assemblies that could be used, and those described herein are by way of example only.

The adhesive material may have a bondline thickness which is uniform. Alternately, the bondline thickness of the adhesive material may be variable along the length of the adhesive material.

The adhesive material may be used as a film adhesive if an optional carrier is added to the material. Alternatively, the adhesive material may be used as a paste adhesive if no carrier is present. It will be understood that the metal-coated additives provide spacing and conductivity, whilst the carrier would generally provide bondline thickness control.

It will be understood that the term "bondline thickness" as used herein refers to the distance between the two substrates which enclose the adhesive material.

The bondline thickness of the adhesive material may typically be in the range between 50 and 400 μm. Preferably, the bondline thickness of the adhesive material is in the range 80 to 300 μm. More preferably, the bondline thickness of the adhesive material is in the range 80 to 200 μm.

The adhesive material of the invention may be fully or partially cured using any suitable temperature, pressure, and time conditions.

The adhesive material may be cured using a method selected from UV-visible radiation, microwave radiation, electron beam, gamma radiation, or other suitable thermal or non-thermal radiation.

Thus, according to a seventh aspect of the present invention there is provided a method of making a cured adhesive material comprising the steps of either the second aspect or the fifth aspect, and curing the adhesive material.

Whilst most of the following discussion concentrates on lightning strike protection, it will readily be seen that there are many potential applications for an adhesive material exhibiting increased electrically conductivity. Thus, the level of conductivity achieved by the present invention will make the resulting adhesive materials suitable for use in electromagnetic shielding, electrostatic protection, current return, and other applications where enhanced electrical conductivity is necessary.

Furthermore, although much of the discussion centres around aerospace components, it is also possible to apply the present invention to lightning strike and other electrical management problems in wind turbines, buildings, marine craft, trains, automobiles and other areas of concern.

The substrates for which the present invention may be used may include, by way of illustration only, metals, plastics, ceramics, fibre reinforced polymers (such as carbon or glass fibre reinforced plastics), reinforced carbon-carbon, metal matrix composites, or plastic impregnated/laminated paper or textiles.

It is envisaged that the present invention, when used for aerospace components, can be used for adhering primary structure parts (i.e. those parts of the structure which are critical for maintaining the integrity of the airplane), as well as adhering secondary structure parts.

All of the features described herein may be combined with any of the above aspects, in any combination.

In order that the present invention may be more readily understood, reference will now be made, by way of example, to the following description and accompanying drawings, in which.

Figure 1:
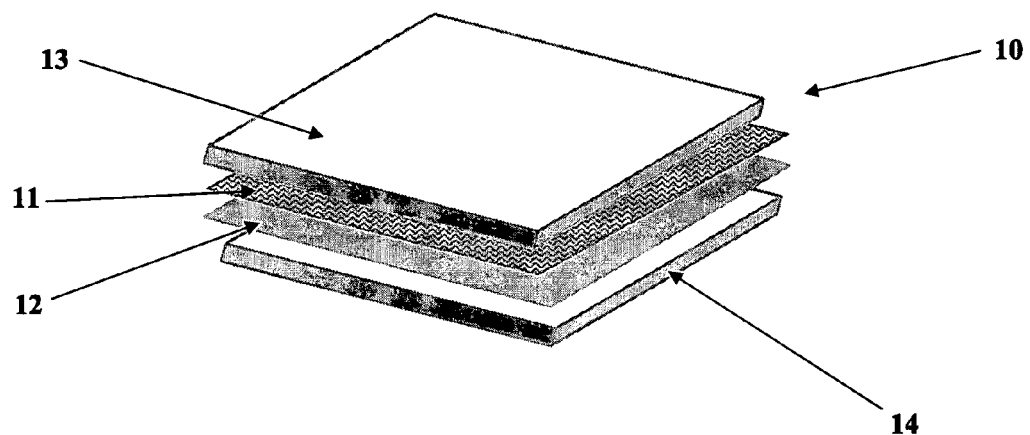
FIG. 1 is a schematic perspective view of a conductive paste joint assembly in which a carrier is used as a spacer.

Referring to FIG. 1, there is shown a schematic perspective view of a typical joint assembly 10. The assembly 10 comprises two substrates 13 and 14 which are aluminium plates. Sandwiched between the substrates 13 and 14 is a non-conductive carrier layer 11, and a layer of paste adhesive material 12. The layer of adhesive material 12 can comprise conductive additives. The whole assembly 10 can be cured.

Figure 2:
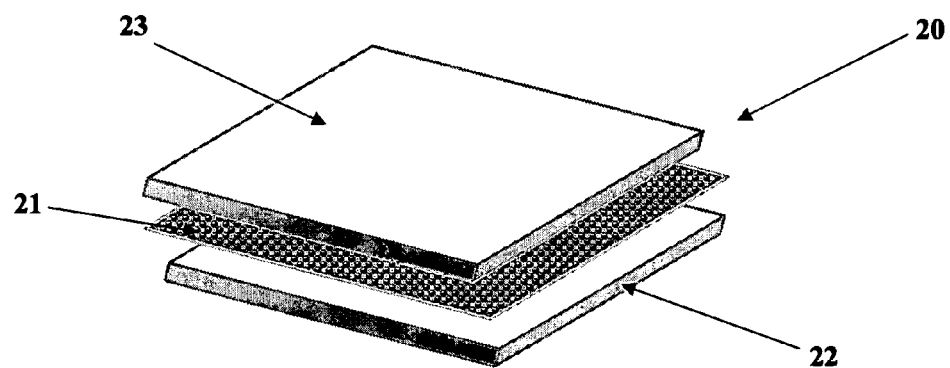
FIG. 2 is a schematic perspective view of a further alternate conductive paste joint assembly in which large spheres are used as spacers.

Referring to FIG. 2, there is shown a schematic perspective view of a further alternate joint assembly 20. The assembly 20 comprises two substrates which are aluminium plates 22 and 23. Sandwiched between the substrates 22 and 23 is a layer of paste adhesive material 21 containing additional spheres (conductive or non-conductive) large enough to control the bondline thickness. A usual size for spacing spheres is 80 μm to 150 μm in diameter. The layer of adhesive material 21 can also comprise conductive additives. The whole assembly 20 can be cured.

Figure 3:
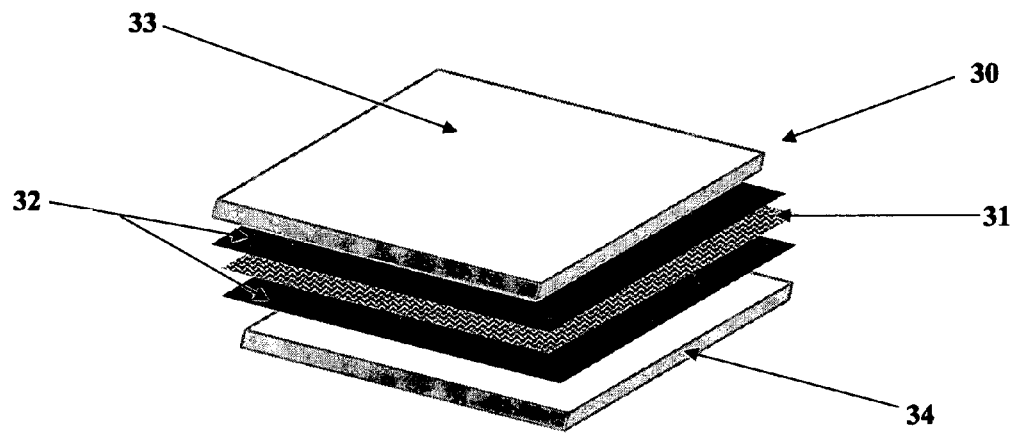
FIG. 3 is a schematic perspective view of an alternate conductive film joint assembly in which a carrier is used as a spacer.

Referring to FIG. 3, there is shown a schematic perspective view of an alternate joint assembly 30. The assembly 30 comprises two substrates 33 and 34. Sandwiched between the substrates 33 and 34 is a non-conductive carrier layer 31, and two layers of adhesive films 32 arranged either side of the carrier layer 31. The layers of adhesive material 32 can comprise conductive additives. The whole assembly 30 can be cured.

Figure 4:
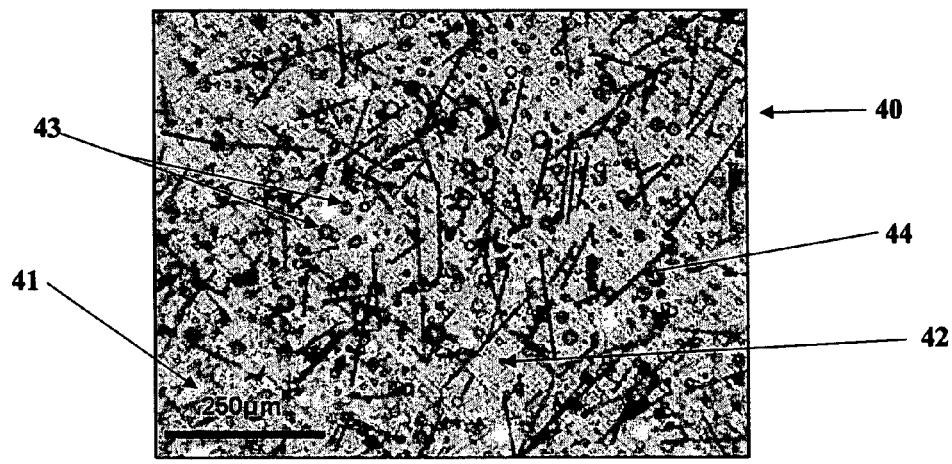
FIG. 4 is a micrograph of a conductive paste film debonded from an assembly of the type shown in FIG. 2.

Referring to FIG. 4, there is show a micrograph of a conductive paste film 40 debonded from a joint assembly 20 of the type shown in FIG. 2. The assembly 40 comprises a paste adhesive material 41 (based on resin used in Example 6-2) and solid glass beads 43 used as a spacer having a diameter of 100 μm and being present at 2 wt. % (Ecka Granules Nanotechnologies, Weert, Netherlands). The adhesive material 41 comprises distributed silver-coated glass beads 42 and silver-coated glass fibres 44. The ratio of fibres 44 to beads 42 is 3:1. The bondline thickness of the adhesive material layer is 100 μm. The fibres 44 and beads 42 are evenly distributed over the bondline of the joint.

Figure 5:
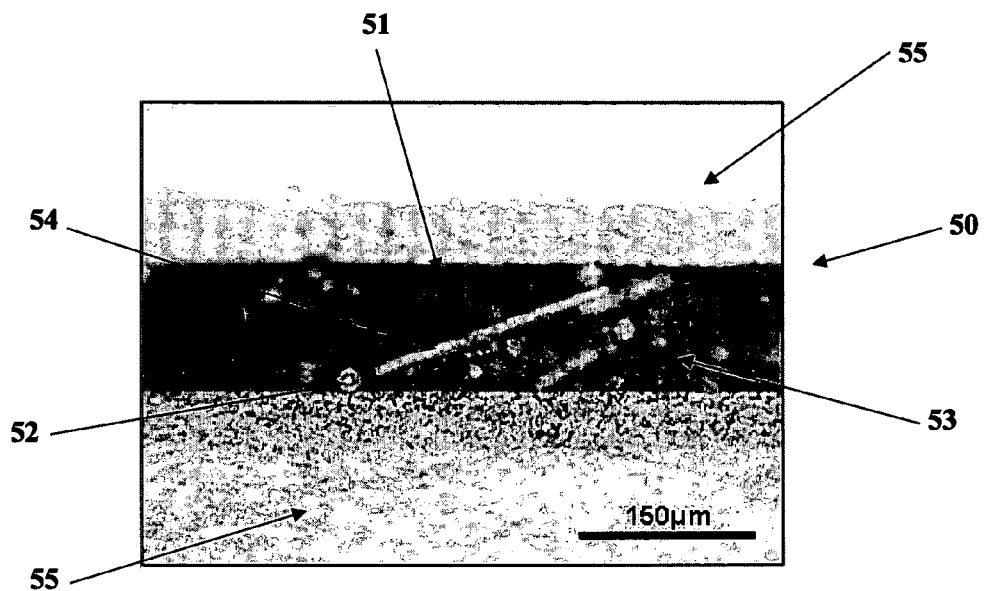
FIG. 5 is a micrograph of a polished section of a conductive adhesive joint.
Figure 6:
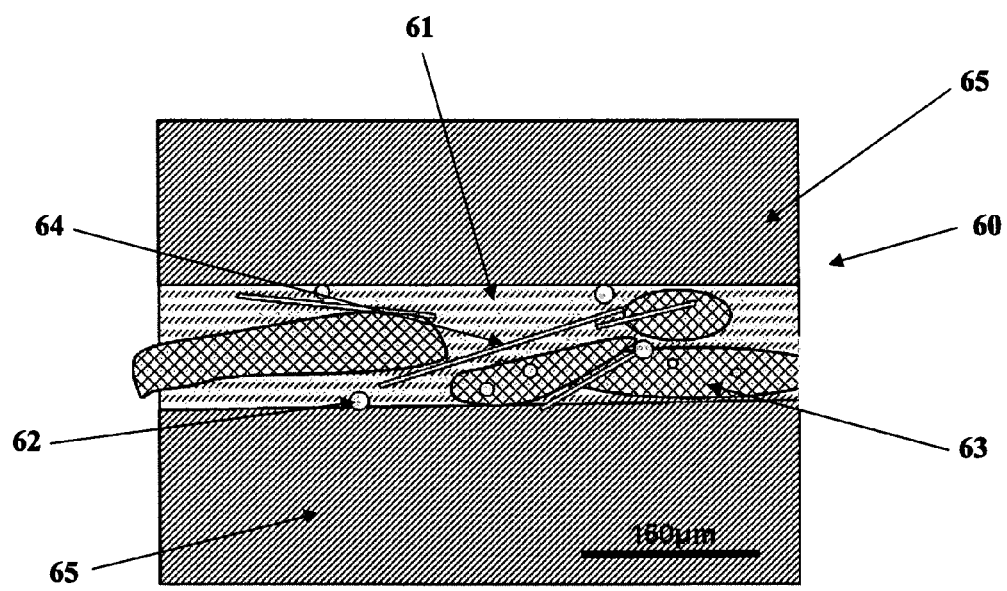
FIG. 6 is a schematic diagram of the conductive adhesive joint shown in FIG. 5.

Referring to FIGS. 5 and 6, there is shown a micrograph (FIG. 5) and a schematic view (FIG. 6) of a polished cross section of an assembly 50 and 60. The assembly 50 and 60 is an aluminium-aluminium joint comprising film adhesive material 51 and 61 (based on resin used in Example 14-2) and a nylon carrier A1050 (Heathcoat of Tiverton, UK) 53 and 63 arranged between two layers of substrate 55 and 65. The adhesive material layer 51 and 61 comprises distributed silver-coated glass beads 52 and 62 and silver-coated glass fibres 54 and 64. The ratio of fibres 54 and 64 to beads 52 and 62 is 3:1. The bondline thickness of the adhesive material layer between the substrates 55 and 65 is 120 μm.

The micrograph (FIG. 5) and the schematic view (FIG. 6) of the assembly 50 and 60 clearly show how the fibres 54 and 64 can directly or indirectly bridge the substrates 55 and 65. The beads 52 and 62 also help to establish a good electrical contact between the fibres 54 and 64 and the substrate 55 and 65, or between the fibres 54 and 64.

Figure 7:
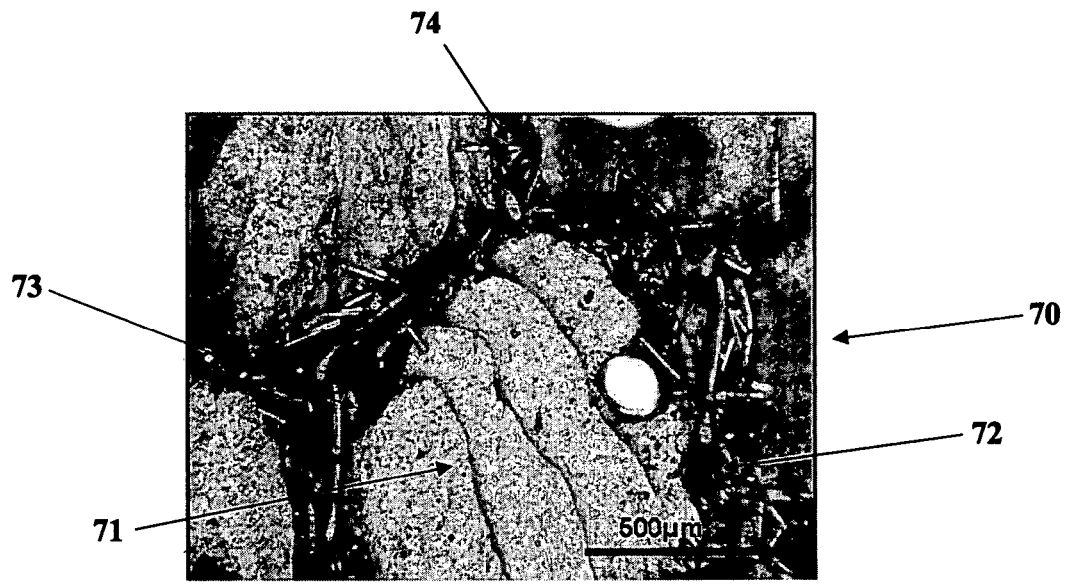
FIG. 7 is a micrograph of a failure surface of a conductive adhesive joint.
Figure 8:
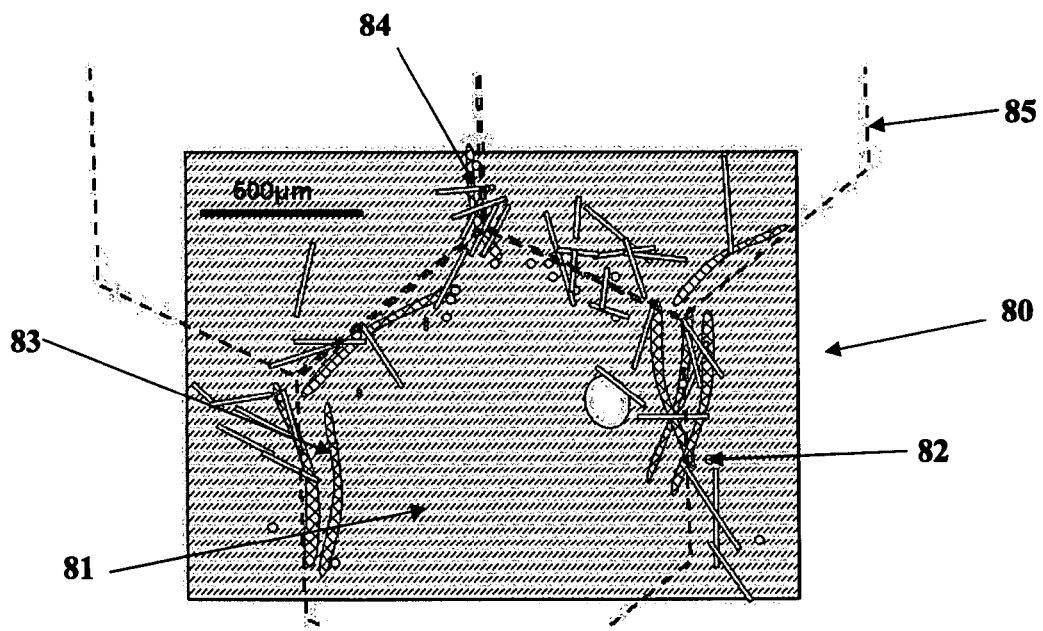
FIG. 8 is a schematic diagram of the conductive adhesive joint shown in FIG. 7.

Referring to FIGS. 7 and 8, there is shown a micrograph (FIG. 7) and a schematic view (FIG. 8) of a failure surface of an assembly 70 and 80. The assembly 70 and 80 is an aluminium-aluminium joint comprising film adhesive material 71 and 81 (based on resin used in Example 14-2). The carrier pattern 73 and 83 is clearly identified and highlighted on the schematic diagram (FIG. 8) by the hexagonal pattern 85 of the carrier (A1050 from Heathcoat, Tiverton, UK). The fibres 74 and 84 and the beads 72 and 82 are filtered by the carrier 73 and 83 which gathers the conductive particles around the carrier strands 73 and 83. The concentration of conductive particle 72, 74, 82, and 84 is therefore higher in specific areas, and helps to build electrical contact through the joint at low loading.

Figure 9:
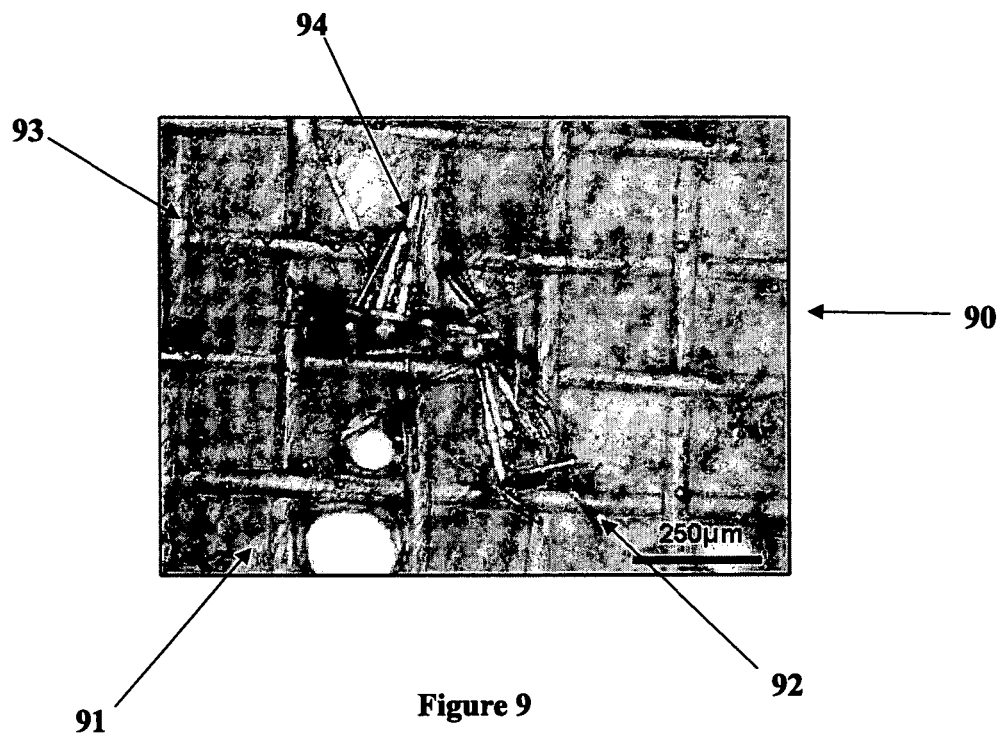
FIG. 9 is a micrograph of a failed section of a conductive adhesive joint.
Figure 10:
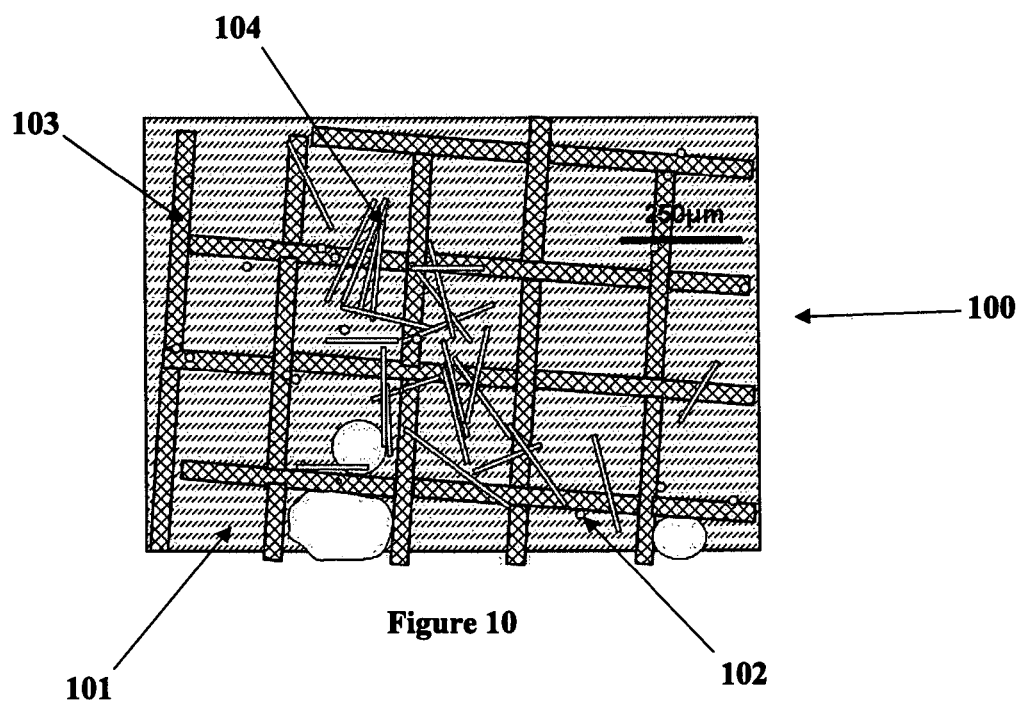
FIG. 10 is a schematic diagram of the conductive adhesive joint shown in FIG. 9.

Referring to FIGS. 9 and 10, there is shown a micrograph (FIG. 9) and a schematic view (FIG. 10) of a failure surface of assembly 90 and 100. The assembly 90 and 100 is a failure surface from an aluminium-aluminium joint comprising film adhesive material 91 and 101 (based on resin used in Example 14-2) and a PET carrier 93 and 103 (F0826 from Heathcoat, Tiverton, UK). In FIGS. 9 and 10, the carrier pattern of the carrier 93 and 103 is clearly identified. The fibres 94 and 104 and the beads 92 and 102 are shown to be filtered and gathered in aggregates, thereby improving the chances of contact between conductive surfaces.

Figure 11:
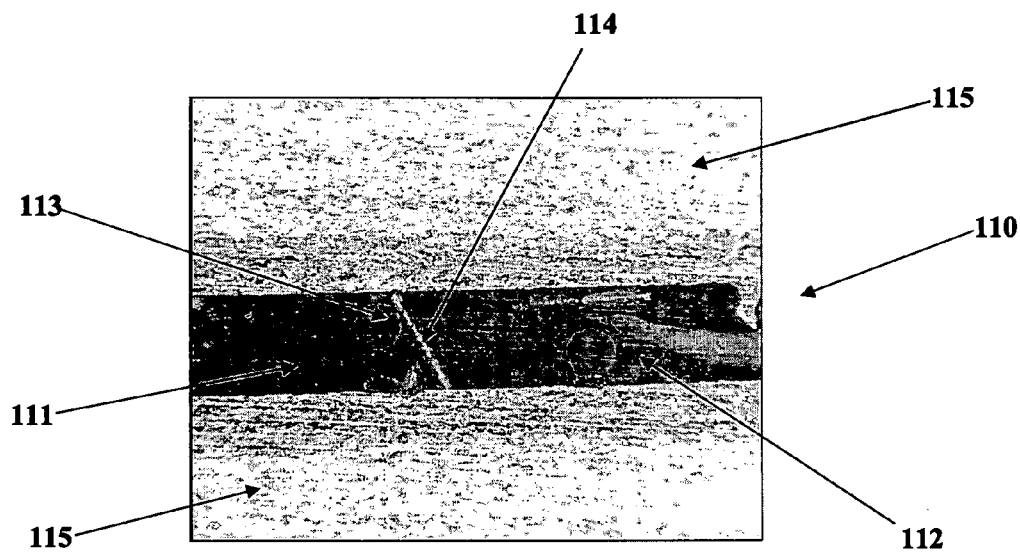
FIG. 11 is a micrograph of a failure surface of a conductive adhesive join.
Figure 12:
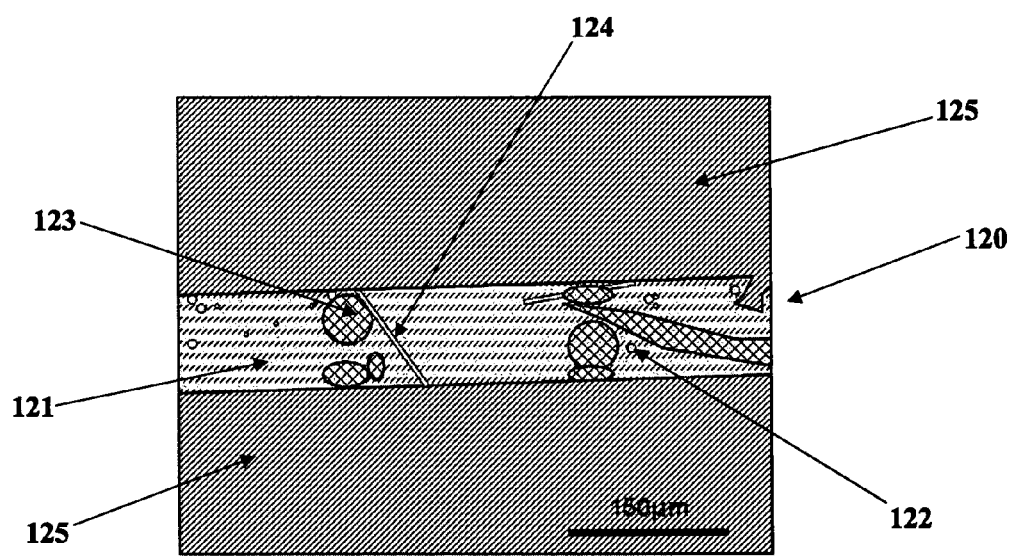
FIG. 12 is a schematic diagram of the conductive adhesive join shown in FIG. 11.

Referring to FIGS. 11 and 12, there is shown a micrograph (FIG. 11) and a schematic view (FIG. 12) of a polished cross section of assembly 110 and 120. The assembly 110 and 120 is an aluminium-aluminium joint comprising film adhesive material 111 and 121 (based on resin from Example 14-2) and a PET carrier 113 and 123 (F0826 from Heathcoat, Tiverton, UK) arranged between two layers of substrate 115 and 125. The adhesive material layer 111 and 121 comprises distributed silver-coated glass beads 112 and 122 and silver-coated glass fibres 114 and 124. The ratio of fibres 114 and 124 to beads 112 and 122 is 3:1. The bondline thickness of the adhesive material layer between the substrates 115 and 125 is 100 μm.

The micrograph (FIG. 11) and the schematic view (FIG. 12) of the joint section clearly show how the fibres 114 and 124 can directly or indirectly bridge the substrates 115 and 125. When films or pastes are used, the thickness is usually controlled by introducing a carrier 113 and 123 in the joint.

In the following examples 1-12, the adhesive paste used as host for the conductive additives is a two part epoxy paste Redux®870 available from Hexcel (Duxford, UK). The conductive additives were added in the part A (epoxy resin) and thoroughly mixed using a Flaktec Speedmixer. The part B (curative) was subsequently added and mixed by the same method prior to being applied on the adherend and cured according to standard conditions. Part A and B were mixed in the proportion 100:45 by weight respectively.

The two-part paste adhesive can be cured at temperatures in the range of 25° C. to 120° C., and in these examples was cured for 1 hour at 100° C. between parallel plate heating presses under 4 bar pressure. The heating rate used was 3° C. per min from 25° C. to 100° C.

The assemblies 10, 20, and 30 shown in FIGS. 1-3 were used for preparation of materials in the specific embodiments detailed below.

The volume resistivity test method for adhesive material is derived from ASTM D2739-97 (reapproved 2004)—*Standards Test Method for Volume Resistivity of Conductive Adhesives*. The main difference between the method D2739-97 and the one used for the purpose of this invention is that volume resistivity of the cured adhesive layer was measured between aluminium adherends instead of silver-plated or gold plated adherends.

The test method measures the resistance of conductive adhesives used in thin joints as part of a bonded assembly. Additionally, the resistivity is measured in only one direction (z), and can be affected by the thickness of the specimen to be measured (distance between the two parallel sides). The measurement is made between two aluminium plates assuming the bulk resistivity of the aluminium is negligible ($\rho_v$ (aluminium)=$2.8\times10^{-8}$ Ωm), and that the contact resistance at the aluminium oxide/adhesive interface surface is also negligible.

The aluminium adherends used in the resistivity tests are standard aluminium plates of aerospace grade 2024 T3. The plates are $74\times74\times1.6$ mm$^3$ and are cleaned with acetone prior to being bonded. The area of $74\times74$ mm$^2$ is therefore the overlap area as previously defined.

The adherends, prior to be bonded, are pickled pre-treated (CSA pre-treated). The pickling procedure conforms to Method O of BSI Code of Practice CP 3012, as well as to the older specification DTD 915B. It is also approximately equivalent to the procedure developed by the Forest Products Laboratory, Wisconsin, USA, and which is known as the "FPL Etch".

It was shown that the quality and thickness of the aluminium oxide layer of the adherend can influence the measured resistivity of the joint. When only degreased and cleaned with acetone, the oxide layer is thicker than after a CSA pre-treatment (described below), and the resistivity of the substrates is thus greater for non-treated plates. In that experiment the substrates are standard aluminium plates conventionally used for adhesive tests. For the purpose of the present invention, the aluminium plates were cleaned with acetone only and the surface quality of the plates is expected to be similar for each set of experiments. The calculated resistivity value is thus expected to be higher than the actual bulk resistivity of the adhesive material itself as the oxide layer is included in the calculation. Ideal adherends would be gold or silver-plated metals.

The system comprises two aluminium plates and a layer of adhesive material $74\times74\times t$ mm$^3$ where t is the thickness of the joint and depends on the spacer used and the pressure applied. A usual value for t is 80 μm to 200 μm. In all the examples below the non-conductive carrier A1050 from Heathcoat (Tiverton, UK) was used as a spacer unless an alternative is stated. When A1050 is used as a spacer, the bondline thickness can vary from 120±15 μm in films to 130±20 μm in pastes.

Two devices are used to measure the electrical resistance through the aluminium-aluminium joint. For resistance values between $10^4$ and $10^{12}$Ω, a resistivity meter model 272 from Monroe Electronics is used. The device is made of a ring electrode and a circular metal electrode placed on the top and bottom surface of the joint specimen respectively. The flat and smooth surface of the aluminium plates ensures the good contact between the electrodes and the specimen. For resistance values between $10^{-6}$ and $10^4$Ω, a precision micro/milli Ohmmeter BS407 from Thurlby Thandar Instruments (TTi) equipped with Kelvin clip leads is used. The clips are plugged on the top and bottom aluminium plates.

The volume resistivity of the adhesive material is therefore calculated from the resistance value obtained and the dimensions of the specimen using the formula characterised herein. The results presented are averages out of at least three specimens.

To evaluate the influence of conductive additives added in paste and film adhesives, lap shear panels were prepared according to the test method AECMA EN2243-1 for each of the formulations presented herein. For the lap shear tests, two aluminium plates are bonded together and cut to form an overlap of $2.5\times1.2$ mm$^2$.

For pastes, 1 wt. % of glass spheres 100 μm in diameter was mixed to the adhesive material to control the bondline thickness. For films, the carrier F0826 available from Heathcoat (Tiverton, UK) was sandwiched between two resin films before cure.

The adhesive materials were cured following the same conditions as for the resistivity test specimens. Six specimens are tested for each batch and the average of the resulting shear strengths is calculated. In order to eliminate the batch to batch variation, the shear strength of the modified adhesive material is compared to the shear strength of the batch of neat resin from which it is made. The retention value is given in percentages.

To evaluate the influence of conductive additives added in paste and film adhesives, viscosity was measured with a parallel plate/controlled shear CVO 120 Rheometer obtained from Bohlin Instruments (Malvern, UK).

The modified or neat part A of adhesive paste was tested at 25° C. between a cone plate 4° angle/40 mm in diameter situated 1 mm away from the bottom plate at a constant shear rate of 4 s$^{-1}$. The resulting complex viscosity value is an average of at least 20 points. To eliminate the batch to batch variation, the viscosity of the modified adhesive material is compared to the viscosity of the batch of neat part A resin from which it is made. The retention value given in percentages in the tables herein was calculated from the $\log_{10}$ of the complex viscosity values.

The film adhesives were cured at 2° C./min up to 240° C. between parallel plates situated 1 mm away from each other and oscillating at a frequency of 3 Hz at constant strain. The viscosity was measured over this range of temperature. The minimum viscosity of the adhesive material containing conductive additives is compared to the minimum viscosity of the neat resin from which it is made.

EXPERIMENTAL RESULTS

Examples 1 to 3 represent prior art reference examples in which the adhesive material comprises polymeric resin and non-metal coated additives only.

Example 1

A neat resin sample of Redux®870 part A was blended with part B in the proportion 100:45 by weight. Specimens for resistivity measurement and lap shear tests were cured and tested following the procedure described above. Results are shown in Table 1.

Example 2

A sample of Redux®870 part A and 8 wt. % carbon nanofibres (Electrovac, Austria) was thoroughly mixed for an extended period of time. The resulting blend was subsequently mixed through a triple-roll mill Copley AR402 (Copley, Nottingham, UK) several times until the desired degree of dispersion of the carbon nanofibres was obtained. The paste obtained was very viscous, and the viscosity could not be tested following the method described above. The part B was then added, and the final blend contained 5.5 wt. % carbon nanofibres. Specimens for resistivity measurement and lap shear tests were cured and tested. Results are shown in Table 1.

Example 3

A sample of Redux®870 part A and 8 wt. % carbon black (Vulcan XC72R grade from Cabot Corporation, The Netherlands) were thoroughly mixed for an extended period of time. The resulting blend was subsequently mixed through a triple-roll mill (obtained from Copley, Nottingham, UK) several times until the carbon black aggregates were distributed. The paste obtained was very viscous, and the viscosity could not be tested following the method described above. The part B was then added, and the final blend contained 5.5 wt. % of carbon black. Specimens for resistivity measurement and lap shear tests are cured were tested. Results are shown in Table 1.

TABLE 1

Volume resistivity, viscosity retention, and shear strength retention of paste adhesive modified with carbon nanofibres and carbon black.

| Ex n° | Carbon Nanofibres wt. % | Carbon Black wt. % | z-direction Volume Resistivity Ωm | Viscosity Retention % | Lap Shear Strength Retention % |
|---|---|---|---|---|---|
| 1 | — | — | $7 \times 10^{11}$ | 100 | 100.0 |
| 2 | 5.5 | — | 120 | high* | 101.3 |
| 3 | — | 5.5 | $5 \times 10^{8}$ | high* | 103.6 |

*Too high to be measured with the same method (>130%)

The results in Table 1 demonstrate that addition of carbon black and carbon nanofibres decreases the volume resistivity of the paste without a substantial effect on the shear properties. However, this results in a large increase in viscosity which would not provide a material capable of being processed under conventional conditions of manufacture and use.

Examples 4-12 represent examples in which the adhesive material comprises polymeric resin and various combinations of metal coated low and high aspect ratio additives.

Example 4

A sample of Redux®870 part A and silver-coated glass fibres 170-210 μm long (Ecka Granules Nanotechnologies, Weert, Netherlands) were easily and quickly mixed. The part B was then added, and final loadings of conductive particles of 3.1, 5.5, and 11 wt. % were obtained (Examples 4-1, 4-2, and 4-3 respectively). Specimens for resistivity measurement and lap shear tests were cured and tested. Results are shown in Table 2.

Example 5

A sample of Redux®870 part A and silver-coated glass beads 20 μm in diameter (Ecka Granules Nanotechnologies, Weert, Netherlands) were easily and quickly mixed. The part B was then added, and final loadings of conductive particles of 2 and 5.5 wt. % were obtained (Examples 5-1, and 5-2 respectively). Specimens for resistivity measurement and lap shear tests were cured and tested. Results are shown in Table 2.

Example 6

A sample of Redux®870 part A, silver-coated glass fibres 170-210 μm long and silver-coated glass beads 20 μm in diameter were easily and quickly mixed to obtain a final loading of 4.1 wt. % fibres and 1.4 wt. % beads (ratio fibres/beads 3:1). The part B was then added. In addition to the usual specimens for resistivity measurement and lap shear tests, an additional specimen for resistivity measurement was prepared. The latter specimen (Example 6-2) contained the same adhesive material, but the spacer A1050 was replaced by 100 μm solid glass beads. All the specimens were cured and tested following the procedure described above. Results are shown in Table 2.

Example 7

A sample of Redux®870 part A, silver-coated glass fibres 170-210 μm long and silver-coated glass beads 20 μm in diameter were easily and quickly mixed. The part B was then added, and a final loading of 8.2 wt. % fibres and 2.8 wt. % beads (ratio fibres/beads 3:1) was obtained. Specimens for resistivity measurement and lap shear tests were cured and tested. Results are shown in Table 2.

TABLE 2

Volume resistivity, viscosity retention, and shear strength retention of paste adhesive modified with silver-coated glass fibres and silver-coated glass beads, separately and together.

| Ex n° | Silvered Glass Fibres wt. % | Silvered Glass Beads wt. % | z-direction Volume Resistivity Ωm | Viscosity Retention % | Lap Shear Strength Retention % |
|---|---|---|---|---|---|
| 1 | — | — | $7 \times 10^{11}$ | 100 | 100.0 |
| 4-1 | 3.1 | — | 55 | 102 | 94.1 |
| 4-2 | 5.5 | — | 0.6 | 105 | 87.1 |
| 4-3 | 11 | — | 0.2 | 107 | 85.5 |
| 5-1 | — | 2 | $2 \times 10^{11}$ | 97 | 98.7 |
| 5-2 | — | 5.5 | $9 \times 10^{10}$ | 98 | 101.7 |
| 6-1 | 4.1 | 1.4 | 0.7 | 104 | 105.9 |
| 6-2 | 4.1 | 1.4 | 1.5 | — | — |
| 7 | 8.2 | 2.8 | 0.2 | 105 | 100.3 |

The results in Tables 1 and 2 demonstrate that addition of silver-coated glass fibres greatly decreases the volume resistivity of the paste even at very low loading. The viscosity of the modified part A is slightly increased with increasing loadings, but importantly remains processable. The shear properties are not significantly affected.

The addition of silver-coated glass beads also decreases the volume resistivity of the paste. The viscosity of the modified part A is decreased and the shear properties are not significantly affected.

Unexpectedly, when combining the silver-coated glass fibres and the silver-coated glass beads, as shown in Examples 6 and 7, the decrease in resistivity is similar to modified adhesive with fibre alone at similar loading. The viscosity is not increased as much as with fibres alone and the shear properties are no longer affected, and even slightly improved at a loading of 5.5 wt. %.

Conductivity is enhanced further at conductive additive loadings of 11 wt. % and the other properties are, unexpectedly, only moderately affected by such a fibre loading.

Example 8

A sample of Redux®870 part A, silver-coated glass fibres 170-210 μm long, and silver-coated glass beads 20 μm in diameter was easily and quickly mixed. The part B was then added, and a final loading of 4.4 wt. % fibres and 1.1 wt. % beads (ratio fibres/beads 4:1) was obtained. Specimens for resistivity measurement and lap shear tests were cured and tested. Results are shown in Table 3.

Example 9

A sample of Redux®870 part A, silver-coated glass fibres 170-210 μm long, silver-coated glass beads 20 μm in diameter was easily and quickly mixed. The part B was then added, and a final loading of 3.7 wt. % fibres and 1.8 wt. % beads (ratio fibres/beads 2:1) was obtained. Specimens for resistivity measurement and lap shear tests were cured and tested. Results are shown in Table 3.

Example 10

A sample of Redux®870 part A, silver-coated glass fibres 170-210 μm long, silver-coated hollow glass beads 20 μm in diameter (Ecka Granules Nanotechnologies, Weert, Netherlands) was easily and quickly mixed. The part B was then added, and a final loading of 4.1 wt. % fibres and 0.6 wt. % (0.52 vol. %) hollow beads was obtained. Specimens for resistivity measurement and lap shear tests were cured and tested. Results are shown in Table 4.

Example 11

A sample of Redux®870 part A, silver-coated glass fibres 170-210 μm long, silver-coated PMMA beads 20 μm in diameter (Ecka Granules Nanotechnologies, Weert, Netherlands) was easily and quickly mixed. The part B was then added, and a final loading of 4.1 wt. % fibres and 0.6 wt. % (0.52 vol. %) PMMA beads was obtained. Specimens for resistivity measurement and lap shear tests were cured and tested. Results are shown in Table 4.

TABLE 4

Volume resistivity, viscosity retention and shear strength retention of paste adhesive modified with silver-coated glass fibres and silver-coated beads made of different cores keeping the volume loading constant.

| Ex n° | Silvered Glass Fibres wt. % | Silvered Glass Beads wt. % (vol. %) | Silvered Hollow Glass Beads wt. % (vol. %) | Silvered PMMA Beads wt. % (vol. %) | z-direction Volume Resistivity Ωm | Viscosity Retention % | Lap Shear Strength Retention % |
|---|---|---|---|---|---|---|---|
| 1 | — | — | — | — | $7 \times 10^{11}$ | 100 | 100.0 |
| 6-1 | 4.1 | 1.4 (0.52) | — | — | 0.7 | 104 | 105.9 |
| 10 | 4.1 | — | 0.6 (0.52) | — | 0.9 | 105 | 100.3 |
| 11 | 4.1 | — | — | 0.6 (0.52) | 1.3 | 115 | 97.7 |

TABLE 3

Volume resistivity, viscosity retention and shear strength retention of paste adhesive modified with silver-coated glass fibres and silver-coated glass beads in various loading ratios.

| Ex n° | Silvered Glass Fibres wt. % | Silvered Glass Beads wt. % | z-direction Volume Resistivity Ωm | Viscosity Retention % | Lap Shear Strength Retention % |
|---|---|---|---|---|---|
| 1 | — | — | $7 \times 10^{11}$ | 100 | 100.0 |
| 6-1 | 4.1 | 1.4 | 0.7 | 104 | 105.9 |
| 8 | 4.4 | 1.1 | 0.7 | 106 | 85.5 |
| 9 | 3.7 | 1.8 | 2.2 | 107 | 99.0 |

Referring to Table 3, the 3:1 ratio of fibres to beads gave the best results amongst the three ratios studied for the same total loading of conductive additives.

Referring to Table 4, metal-coated hollow glass beads and metal-coated polymer beads offer a good light weight alternative to the solid glass beads.

Example 12

A sample of Redux®870 part A and silver-coated glass beads 100 μm in diameter (Ecka Granules Nanotechnologies, Weert, Netherlands) was easily and quickly mixed. The part B was then added and a final loading of conductive particles of 2.7 wt. % was obtained. No carrier or additional spacer was added to control the thickness. Specimens for resistivity measurement and lap shear tests were cured and tested. Results are shown in Table 5. The bondline thickness of the cured joint was measured by image analysis from a cut and polished view of the resistivity test specimens. The bondline of the joints cured with 100 μm conductive beads was 100±10 μm thick.

TABLE 5

Volume resistivity, viscosity retention and shear strength retention of paste adhesive modified with conductive adhesives.

| Ex n° | Silvered Glass Fibres wt. % | Silvered Glass Beads 20 µm wt. % | Silvered Glass Beads 100 µm wt. % | z-direction Volume Resistivity Ωm | Viscosity Retention % | Lap Shear Strength Retention % |
|---|---|---|---|---|---|---|
| 1 | — | — | — | $7 \times 10^{11}$ | 100 | 100.0 |
| 6-1 | 4.1 | 1.4 | — | 0.7 | 104 | 105.9 |
| 12 | — | — | 2.7 | 0.05 | 98 | 104.5 |

In adhesive paste, it is unusual to use a carrier to control the thickness but the results in Table 5 show when using conductive beads as spacers, the conductivity level is high compared to other method using metal-coated additives. It also provides for good advantages such as easy dispersion, low additional weight and no viscosity increase, but the conditions of use are more limiting as the particle size must be accurately adapted to the bondline thickness of the joint.

In the following Examples 13-14, two adhesive films are used as hosts for the conductive additives. One is an epoxy-based films Redux®330 available from Hexcel (Duxford, UK). The second is also an epoxy-based adhesive film referenced as Resin and has a similar composition as Redux®330. The adhesive material was prepared by blending all the components uniformly in a Z-blade mixer (Winkworth Machinery Ltd, Reading, UK). The conductive particles were added during this process without altering the mixing parameters. The resins were cast into 110 gsm to 120 gsm films prior to be assembled with the carrier, applied on the adherend, and cured following conventional conditions.

The two adhesive films used in these examples were cured for 1 hour at 175° C. between parallel plate heating presses under 4 bar pressure. The heating rate was 3° C. per min from room temperature to 175° C.

Example 13

Neat resins were prepared in a Z-blade mixer and cast into 110 gsm films. Specimens for resistivity measurement and lap shear tests were cured and tested following the procedure described before. Results for resistivity, viscosity and shear strength measurement are summarised in Table 6. The bondline thickness of the cured joint was measured by image analysis from a cut and polished view of the resistivity test specimens. The bondline of the joints cured with A1050 was 120±15 µm thick.

Example 14

Prior to the preparation of the adhesive materials, the conductive additives were distributed into one of the liquid resins constitutive of the adhesive materials Redux®330 and neat resin using a Flaktec speedmixer. The adhesive material was then prepared, including this premix, in a Z-blade mixer and cast into 110 gsm films. The final resin film contained 4.1 wt. % silver coated glass fibres and 1.4 wt. % beads (ratio fibres/beads 3:1). Specimens for resistivity measurement and lap shear tests were cured and tested following the procedure described before. The bondline of the joints cured with A1050 was 120±15 µm thick. Results for resistivity, viscosity and shear strength measurement were summarised in Table 6.

TABLE 6

Volume resistivity, viscosity and shear strength of adhesive films modified with conductive additives.

| Ex n° | Adhesive film | Silvered Glass Fibres wt. % | Silvered Glass Beads wt. % | z-direction Volume Resistivity Ωm | Minimum Viscosity Retention % | Lap Shear Strength Retention % |
|---|---|---|---|---|---|---|
| 13-1 | Redux330 | — | — | $2 \times 10^{11}$ | 100 | 100 |
| 14-1 | Redux330 | 4.1 | 1.4 | 0.12 | 106 | 85 |
| 13-2 | Resin | — | — | $7 \times 10^{11}$ | 100 | 100 |
| 14-2 | Resin | 4.1 | 1.4 | 0.09 | 97 | 144 |

The addition of a combination of conductive fibres and beads into adhesive film resins shows a great improvement in conductivity but also minimum changes in viscosity and thus processability. The effect on shear properties is variable depending on the adhesive material system tested but can potentially be beneficial.

The conductivity through adhesive joints can thus be improved greatly by the addition of a low loading of carefully chosen conductive particles. The use of a combination of high aspect ratio particles such as fibres and low aspect ratio particles such as spheres close to a volume ratio 3:1 shows improved conductivity levels and unchanged or manageable changes in viscosity and mechanical properties. Another benefit of this invention is that dispersion of such particles is relatively easy and does not require any major change of processing.

It is to be understood that the invention is not to be limited to the details of the above embodiments, which are described by way of example only. Many variations are possible and conductive particles of different types (eg. glass, carbon, PMMA) and sizes were evaluated and different conductive spacers (eg. spheres) were also tested alone or in combination.

The invention claimed is:

1. An adhesive material that provides electrical conductance across a bondline having a thickness in the range between 50 microns and 400 microns, said adhesive material comprising:
   a) an adhesive polymeric resin that is in the form of a bondline between two substrates wherein the thickness of said bondline is in the range between 50 microns and 400 microns and wherein said adhesive polymeric resin has a lap shear strength; and
   b) low aspect ratio metal-coated additives disbursed in said adhesive polymeric resin; and
   c) high aspect ratio metal-coated additives disbursed in said adhesive polymeric resin in an amount in the range of 2 weight percent to 15 weight percent so as to provide electrical conductance across said bondline and wherein the weight ratio of said high aspect ratio metal-coated additives to said low aspect ratio metal-coated additives is about 3 to 1, wherein the lap shear strength of said adhesive material is equal to or greater than the lap shear strength of said adhesive polymeric resin.

2. An adhesive material according to either claim 1 wherein the low aspect ratio metal-coated additives are selected from metal-coated particles, metal-coated spheres, metal-coated dendrites, metal-coated beads, any other metal-coated three-dimensional bodies, or any combination thereof.

3. An adhesive material according to claim 1, wherein the low aspect ratio metal-coated additives comprise a core material which is completely or partially coated by at least one suitable metal.

4. An adhesive material according to claim 3, wherein the core material is formed from polymer, rubber, ceramic, glass, carbon, metal, metal alloy, mineral, or refractory products.

5. An adhesive material according to claim 3 wherein the core material is porous or hollow, or comprises a core-shell structure.

6. An adhesive material according to claim 1, wherein the high aspect ratio metal-coated additives are selected from metal-coated particles, metal-coated flakes, metal-coated rods, metal-coated nanofibres, any other metal coated three-dimensional bodies, or any combination thereof.

7. An adhesive material according to claim 1, wherein the high aspect ratio metal-coated additives comprise a core material which is completely or partially coated by at least one suitable metal.

8. An adhesive material according to claim 7, wherein the core material is selected from polymer, rubber, ceramic, glass, carbon, metal, metal alloy, mineral, carbon nanotubes, and carbon nanofibres.

9. An adhesive material according to claim 1, wherein the metal coating for the low aspect ratio is selected from silver, gold, nickel, copper, tin, aluminium, platinum, palladium, bronze, brass, pewter, cupronickel, and duralumin.

10. An adhesive material according to claim 9, wherein the electrical resistivity of the metal coating is less than $3 \times 10^{-5}$ $\Omega$m.

11. An adhesive material according to claim 1, wherein the adhesive polymeric resin of the adhesive material is a thermoset or thermoplastic resin.

12. An adhesive material according to claim 1, wherein the adhesive material further comprises metallic or non-metallic particles.

13. An adhesive material according to claim 12, wherein the metallic particles are formed from silver, gold, nickel, copper, tin, aluminium, platinum, palladium, bronze, brass, sterling silver, pewter, cupronickel, or duralumin.

14. An adhesive material according to claim 12, wherein the non-metallic particles are selected from any of the following, either alone or in combination; graphite flakes, graphite powders, graphite particles, graphene sheets, carbon nanotubes, carbon nanofibres, fullerenes, carbon black, intrinsically conducting polymers, or charge transfer complexes.

15. An adhesive material according to claim 1, wherein the adhesive material comprises at least one carrier.

16. An adhesive material according to claim 1, wherein the adhesive material comprises at least one curing agent.

17. An adhesive material according to claim 1, wherein the adhesive material comprises additional ingredients selected from flexibilisers, toughening particles/agents, additional accelerators, core shell rubbers, flame retardants, wetting agents, expanding and blowing agents, pigments/dyes, flame retardants, plasticisers, UV absorbers, anti-fungal compounds, fillers, viscosity modifiers/flow control agents, tackifiers, stabilisers, and inhibitors.

18. An adhesive material according to claim 1 wherein the bond line thickness is between 90 microns and 110 microns.

19. An adhesive material according to claim 1 wherein said low aspect ratio metal-coated additives are metal-coated beads and said high aspect ratio metal-coated additives are metal-coated fibers.

20. An adhesive material according to claim 19 wherein said low aspect ratio metal-coated additives have a sizes in the range of 10 to 40 microns and wherein said high aspect ratio metal-coated additives have lengths in the range of 150 to 300 microns.

* * * * *